US005895740A

United States Patent [19]
Chien et al.

[11] Patent Number: 5,895,740
[45] Date of Patent: Apr. 20, 1999

[54] METHOD OF FORMING CONTACT HOLES OF REDUCED DIMENSIONS BY USING IN-SITU FORMED POLYMERIC SIDEWALL SPACERS

[75] Inventors: Rong-Wu Chien, Chayi; Tzu-Shih Yen, Taipei, both of Taiwan

[73] Assignee: Vanguard International Semiconductor Corp., Hsinchu, Taiwan

[21] Appl. No.: 08/747,273

[22] Filed: Nov. 13, 1996

[51] Int. Cl.[6] .................................................. G03F 7/00
[52] U.S. Cl. .......................... 430/313; 430/314; 430/317; 216/17; 216/46
[58] Field of Search ..................................... 430/313, 314, 430/317, 323, 324; 216/17, 37, 46

[56] References Cited

U.S. PATENT DOCUMENTS

| | | | |
|---|---|---|---|
| 4,707,218 | 11/1987 | Giammarco et al. | 216/46 |
| 4,838,991 | 6/1989 | Cote et al. | 430/323 |
| 5,296,410 | 3/1994 | Yang | 438/696 |
| 5,459,099 | 10/1995 | Hsu | 216/46 |
| 5,567,658 | 10/1996 | Wang et al. | 438/697 |
| 5,593,813 | 1/1997 | Kim | 430/312 |

Primary Examiner—Kathleen Duda
Attorney, Agent, or Firm—Tung & Associates

[57] ABSTRACT

A method of forming cavities in a non-conducting layer on a semiconductor device is provided which can be carried out by first providing a pre-processed semi-conducting substrate which has a non-conducting layer and a patterned photoresist layer sequentially deposited and formed on top, and then conformally depositing a polymeric material layer on top of the non-conducting and the photoresist layer, and then etching the polymeric material layer to form polymeric sidewall spacers on the patterned photoresist layer, and then etching cavities in the non-conducting layer to expose the semi-conducting substrate. The polymeric sidewall spacers formed on the sidewalls of the photoresist openings allow the fabrication of cavities such as contact holes or line spacings of reduced dimensions while utilizing a conventional low cost photolithographic method for patterning.

20 Claims, 2 Drawing Sheets

METHOD OF FORMING CONTACT HOLES OF REDUCED DIMENSIONS BY USING IN-SITU FORMED POLYMERIC SIDEWALL SPACERS

FIELD OF THE INVENTION

The present invention generally relates to a method of forming contact holes in an electronic structure and more particularly, relates to a method of forming contact holes, line spacings or trenches of reduced dimension in a non-conducting material layer of a semiconductor device by using polymeric spacers in-situ formed on photoresist sidewalls.

BACKGROUND OF THE INVENTION

Modern semiconductor devices are built on semi-conducting substrates such as silicon substrates that have $P^+$ and $N^+$ type doped regions in the substrates as basic elements of the device. These doped regions must be connected in a specific configuration to form a desired circuit. The circuit needs to be accessible to the outside world through conducting pads for testing and through bonding into a packaged chip. To form a semiconductor circuit, at least one layer of a conducting material such as metal must be deposited and patterned to form contacts and interconnects between the different regions of the chip. For instance, in a typical semiconductor fabrication process, a silicon wafer is first covered with an insulating layer and then, patterned and etched for contact openings in the insulating layer. A conductive material is then deposited and defined to form contact plugs and interconnecting leads.

Contact windows (or holes) to a silicon or silicide layer are usually defined and etched in an insulating layer, i.e., a dielectric material layer, by using lithographic and dry etching techniques. A dry etching technique works anisotropiclly to enable the opening of contact holes that have high aspect ratios. Once formed, contact holes can be filled with a conducting material such as a metal to form vertical connections to a first level metal. Contact holes can also be made by a wet etch process. A wet etch process is carried out by immersing a wafer in an appropriate etchant solution or by spraying the wafer with a solution. When a wet etch process is used, the etching action is isotropic in nature such that the material is etched in both the lateral and the vertical directions. Lateral etching in a wet etch process produces undercutting under a mask which is undesirable in most fabrication processes. On the other hand, a dry etch process etches anisotropically and creates vertical sidewalls in a contact hole such that the top and the bottom of the hole have almost the same dimensions. The dry etch process is frequently used in modern sub-micron devices since it does not create undercutting problem and does not require or waste additional lateral area for a contact hole. The dry etching process further provides the benefits of reduced chemical hazard and waste treatment problems, easily achievable process automation and tool clustering. Two of the most widely used dry etching techniques are the plasma etching technique and the reactive ion etching technique.

While dry etching technique provides significant improvement in dimensional control and therefore is popular in VLSI and ULSI fabrication methods, it also has some limitations. One of such limitations is its inability of scaling down patterning dimensions. In a modern ULSI device, both the horizontal and the vertical device dimensions must shrink continuously to accommodate the ever increasing density of the device. The ability of a fabrication technique to scale down devices to smaller geometries therefore becomes increasingly important. The minimum feature size, i.e., the size of a contact hole, the smallest line-width or line-to-line separation which can be printed on the surface of a chip controls the number of circuits that can be placed on the chip and therefore has a direct impact on the chip density. The evolution of high density chip design is therefore limited by the evolution of lithographic techniques which are normally used to lay down device geometries on a chip.

Among the major lithographic techniques, optical, electron-beam, X-ray and ion-beam, optical lithographic technique using an ultraviolet (UV) light source has been the most important technology. The most commonly used ultraviolet light source for optical lithography are high-pressure arc lamps and laser sources. Major regions of the emitted light spectrum that are produced include the deep ultraviolet (DUV) region which is in the 100~300 nm range, the mid-UV region which is in the 300~360 nm range, and the near-UV region which is in the 360~450 nm range. For instance, when a mercury-xenon arc lamp is used, the dominant wavelengths produced are 254 nm (DUV), 365 nm (I-line), 405 nm (H-line) and 436 nm (G-line). Since most of the photoresist materials require a photo energy higher than 2.5 eV for proper exposure, only wavelengths of 436 nm or shorter can be considered for lithography. When the minimal feature size desired is larger than about 2 μm, the full emitted spectrum of a mercury-xenon arc lamp can be used to expose the resist. For smaller feature sizes, the lens is corrected for one or two of the wavelengths and filters are used to remove the remainder of the spectrum. For instance, the G-line wavelength can be used for feature sizes down to approximately 0.8 μm while the I-line wavelength can be used for feature sizes in the range between 0.4~0.8 μm. For even smaller feature sizes, i.e., below 0.4 μm, shorter wavelengths such as the DUV wavelength at 248 nm must be used with very sensitive DUV photoresist.

In modern VLSI manufacturing, state-of-the-art fabrication process for 16 Mbit or larger DRAMs is designed by the less than 0.4 μm process, i.e., a 0.25 μm process. The diameters of contact holes, for example, have to be less than 0.3 μm. Since the I-line capability is only 0.4 μm (with adequate process margin), the shorter wavelength DUV technique and very sensitive DUV photoresist material must be used. The DUV technique and the DUV photoresist material are both high cost and therefore significantly increase the fabrication costs of the IC device.

FIGS. 1 and 2 illustrate a conventional process wherein a photolithographic method and a dry etching technique are used to form contact holes that have vertical sidewalls in a dielectric material layer. The figures illustrate the limitation on the minimum diameter of the contact holes that can be formed due to the resolution limit of the I-line wavelength. In FIG. 1, a semiconductor device 10 is shown which has a semi-conducting substrate 12 and a dielectric film layer 14 deposited on top. The semi-conducting substrate 12 can be a silicon substrate and the dielectric film layer 14 can be a silicon oxide layer or a silicon nitride layer. On top of the dielectric film layer 14, a photoresist layer 16 is first deposited and then patterned to create openings 20. The photoresist layer 16 is patterned by an optical method using ultraviolet I-line wavelength and thus, the resolution is limited to 0.4 μm as shown by A in FIG. 1. After the photoresist layer 16 is exposed and developed, contact holes 22 having a diameter of A are dry etched in the dielectric film layer 14. Since a dry etching technique, i.e., a reactive ion etching technique, is capable of producing openings of vertical sidewalls, the contact holes 22 formed has substantially vertical sidewalls such that the top of the hole and the bottom of the hole have the same diameter of A (or 0.4 μm). When a contact hole smaller than 0.4 μm is desired, the more expensive and difficult photolithographic technique that utilizes deep UV wavelength and very sensitive photoresist material must be used.

It is therefore an object of the present invention to provide a method for forming contact holes of reduced dimensions that is beyond the resolution limit of normal I-line photolithographic technique.

It is another object of the present invention to provide a method of forming cavities in an electronic device of reduced dimensions that does not require the use of expensive deep-UV photolithographic technique and deep-UV photoresist material.

It is a further object of the present invention to provide a method of forming cavities in a semiconductor device of reduced dimensions utilizing the I-line photolithographic technique by making minor modifications in the fabrication process.

It is another further object of the present invention to provide a method of forming cavities in a semiconductor device such as contact holes and line spacings of reduced dimensions by using in-situ formed polymeric sidewall spacers on a photoresist layer.

It is yet another object of the present invention to provide a method of forming contact holes or line spacings of reduced dimensions by utilizing polymeric sidewall spacers formed on a photoresist layer as masks for etching cavities in a non-conducting layer deposited on a semiconductor substrate.

It is still another object of the present invention to provide a method of forming contact holes of reduced dimensions by using polymeric sidewall spacers that are formed by reactant gases substantially similar to those used in the dry etching process for the holes.

It is still another further object of the present invention to provide a method of forming contact holes of reduced dimensions by forming polymeric sidewall spacers on a photoresist layer and etching contact holes in a dielectric layer in the same process chamber.

It is yet another farther object of the present invention to provide a method of forming contact holes of reduced dimensions by forming polymeric sidewall spacers on a photoresist layer by a reactant gas mixture by including $C_4F_8$ and $CHF_3$.

SUMMARY OF THE INVENTION

The present invention provides a method of forming cavities of reduced dimensions by using polymeric sidewall spacers in-situ formed on a photoresist layer in the same process chamber used for dry etching the cavities.

In a preferred embodiment, a method of forming cavities of reduced dimensions by using polymeric sidewall spacers in-situ formed on a photoresist layer can be conducted by first providing a semi-conducting substrate which has a non-conducting layer deposited on top, then depositing and patterning a photoresist layer on top of the non-conducting layer to expose a predetermined area for the cavity on the non-conducting layer, depositing a layer of a polymeric material to cover the photoresist and the predetermined area of the non-conducting layer, anisotropically etching the conformal layer of polymeric material to form polymeric spacers on the photoresist sidewalls, and etching cavities of reduced dimensions through the non-conducting layer to expose the semi-conducting substrate.

In an alternate embodiment, a method of forming cavities in a non-conducting layer can be carried out by the steps of first providing a pre-processed semi-conducting substrate which has a non-conducting layer and a patterned photoresist layer sequentially deposited and formed on top, then conformally depositing a polymeric material layer on top of the non-conducting and the photoresist layer, etching the polymeric material layer to form polymeric sidewall spacers on the patterned photoresist layer, and etching cavities in a non-conducting layer to expose the semiconducting substrate.

In another alternate embodiment, a method of forming contact holes of reduced dimensions in a single process chamber can be carried out by first providing a silicon substrate, then depositing a dielectric layer on the silicon substrate, depositing a photoresist layer on the dielectric layer, patterning the photoresist layer to form first openings to expose the dielectric layer for the contact holes, conformally depositing a polymeric material layer in the first openings and on top of the photoresist layer, anisotropically etching the polymeric material layer to form polymeric sidewall spacers in the first openings to cover the sidewall of the photoresist layer, anisotropically etch the dielectric layer to form second openings to expose the silicon substrate by using the polymeric sidewall spacers as masks such that the second openings are smaller than the first openings to enable the formation of contact holes of reduced dimensions, and removing the photoresist layer from the dielectric layer.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention provides a method of forming cavities such as contact holes, line spacings or trenches of reduced dimensions in a semiconductor device by using polymeric sidewall spacers that are in-situ formed on photoresist sidewalls in the same process chamber used for dry etching the cavities.

Figure 1:
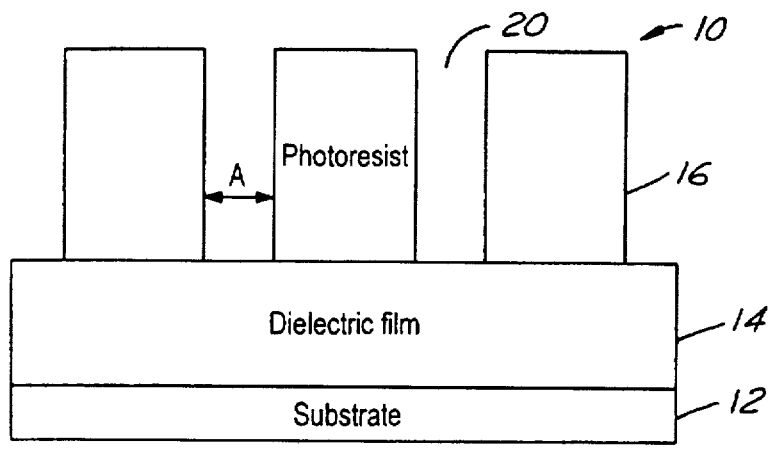
FIG. 1 is an enlarged, cross-sectional view of a conventional semi-conducting substrate which has a dielectric layer and a patterned photoresist layer sequentially deposited and formed on top.
Figure 2:
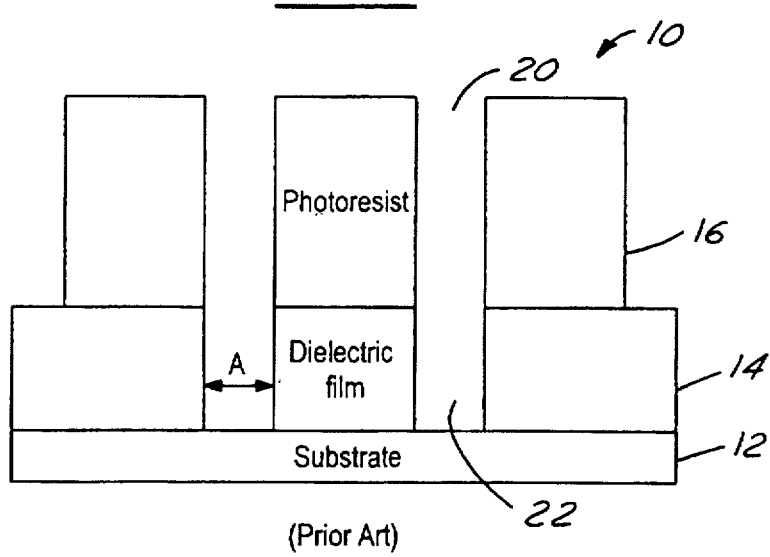
FIG. 2 is an enlarged, cross-sectional view of the conventional semiconductor device shown in FIG. 1 with contact holes of the same size as the contact openings formed in the dielectric material layer.
Figure 3:
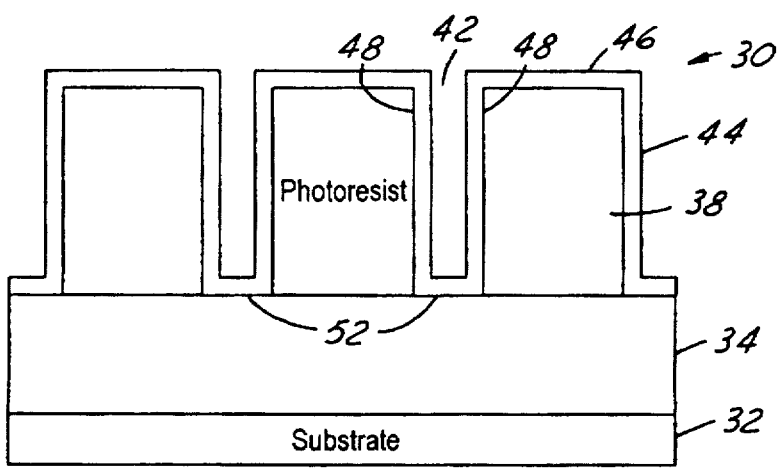
FIG. 3 is an enlarged, cross-sectional view of the present invention semiconductor device having a polymeric material layer conformally deposited on top of a patterned photoresist layer and a dielectric material layer.

Referring initially to FIG. 3 where an enlarged, cross-sectional view of a semiconductor device 30 is shown.

Device 30 is formed on a silicon substrate 32 and onto which a thick oxide layer 34 is formed as a dielectric material layer. The oxide layer 34 can be formed by a thermal oxidation process or can be suitably deposited of any other dielectric material such as nitride or BPSG (boro-phosphor-silicate glass). Other suitable dielectric materials can also be deposited. The thickness of the dielectric material layer 34 can be in the range of between about 3000 Å and about 12000 Å.

In order to form cavities such as contact holes, line spacings or trenches in the dielectric layer 34, a photoresist layer 38 must first be deposited on top of the dielectric layer 34. The photoresist layer 38 can be of the type that is suitable for optical lithographic technique that utilizes I-line ultraviolet wavelength and that can be exposed and developed at relatively low cost. After the photoresist layer 38 is exposed and developed to provide openings 42 for contact holes, instead of immediately conducting a dry etching process for etching contact holes into the dielectric layer 34 such as that performed in a conventional process, a polymeric material layer 44 is deposited on top of the photoresist layer 38. As one of the novel features of the present invention, the polymeric material layer 44 can be conveniently deposited in the same process chamber (not shown) where etching is to be conducted in a latter process step. The polymeric material layer 44 is therefore deposited in-situ and presents a significant process advantage.

The reactant gas mixture used in depositing the polymeric material layer 44 can be, in general, substantially similar to that used in the subsequent etching process, i.e., the mixture consists of $C_4F_3$, $CHF_3$, CO and Ar. In a typical deposition process for the polymeric material layer 44, the following reactant gas flow rates can be used: 20 sccm for $C_4F_8$, 80 sccm for $CHF_3$, 140 sccm for CO, and 100 sccm for Ar. The reactant gas mixture may optionally contain about 40 sccm $N_2$. When the deposition process is conducted in a reactive ion etching chamber, the upper electrode is maintained at 20° C., the lower electrode is maintained at 0° C., while the chamber wall is maintained at 40° C. The chamber pressure of 400 m Torr and a RF power of 500 W are used for a deposition time of 1 minute. The rate of deposition for a polymeric material layer under such processing conditions is approximately 3000 Å/min.

It should be noted that during the polymeric material deposition process, a layer of the material is deposited to uniformly cover the sidewalls 48 of the openings 42 in the photoresist layer 38 and the exposed areas 52 on the dielectric layer 34. In the deposition process, the thickness and the quality of the polymeric layer which ultimately determines the final diameter of the contact holes formed, i.e., the thicker the polymeric material layer which produces a thicker polymeric sidewall spacer and subsequently a smaller contact hole are determined and controlled by the reactant gas mixture ratio (of $C_4F_8/CHF_3/CO$), the power applied to the chamber, the chamber pressure and the helium cooling gas flow rate. The present invention method of depositing polymeric material layer therefore presents great processing advantages over the conventional method of making contact holes. By suitably adjusting the processing parameters as stated above, a thicker polymeric layer can be deposited to form smaller diameter contact holes, while on the other hand, a thinner polymeric layer can be deposited to form larger diameter contact holes.

Another processing advantage made possible by the present invention novel method is that the polymeric material layer deposition process can be conducted in the same process chamber where a reactive ion etching process is to be conducted. The reactant gas mixture used in forming the polymeric layer is substantially similar to that used in the subsequent reactive ion etching process for forming contact holes in the dielectric layer. For instance, in both the deposition and the etching processes, the common reactant gases used are $CHF_3$, $N_2$, and Ar with the only difference being that $CF_4$ is used in the etching process while $C_4F_8$ and CO is used in the deposition process. The similarity in the reactant gases used simplifies the present invention method since the gas storage and delivery equipment needed are simplified.

Figure 4:
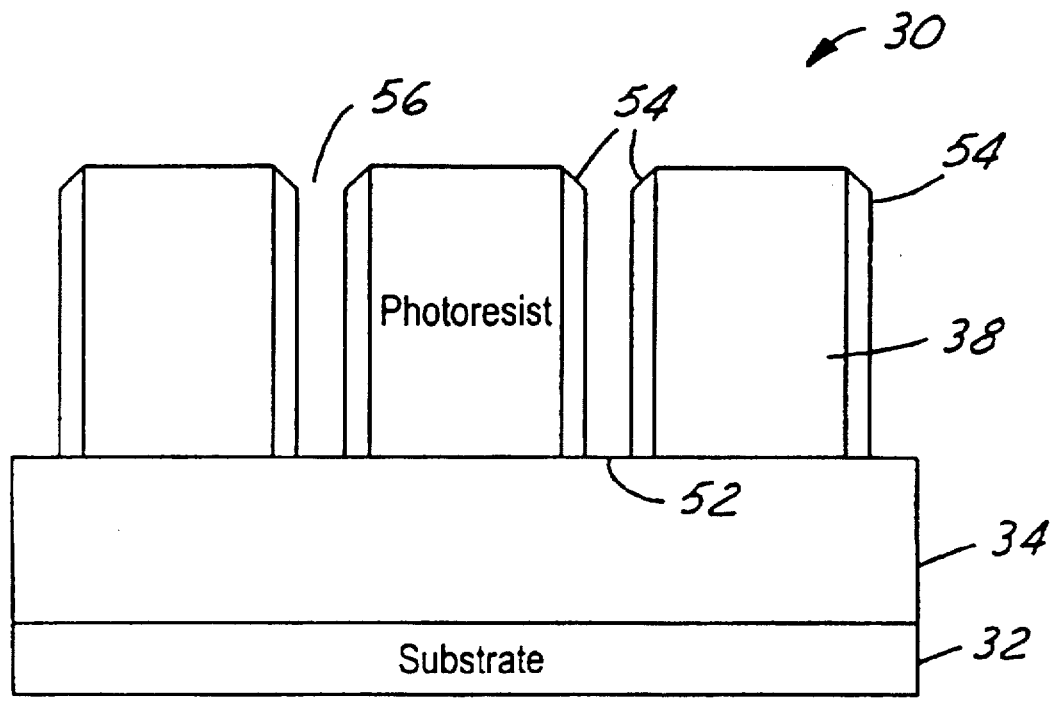
FIG. 4 is an enlarged, cross-sectional view of the present invention semiconductor device shown in FIG. 3 after a polymeric sidewall spacers are formed on the sidewalls of the photoresist layer.

After the polymeric material layer 44 is suitably formed on the dielectric material layer 34, a dry etch process conducted to form polymeric sidewall spacers 54. This is shown in FIG. 4. A suitable dry etch process is a reactive ion etch process which is capable of anisotropically etch away both the top layer 46 of the polymeric material layer 44 (shown in FIG. 3) and the polymeric material deposited in the exposed dielectric area 52 such that only sidewall spacers 54 are left intact. One of the suitable etching gas mixtures can be used is $CF_4$, $CHF_3$, $N_2$ and Ar. In the spacer forming step, a low power, soft ash process can be suitably used. A suitable reactant gas can be provided by 100 sccm $CF_4$. A suitable power level used is 200 W and a suitable chamber pressure used is 300 m Torr.

Figure 5:
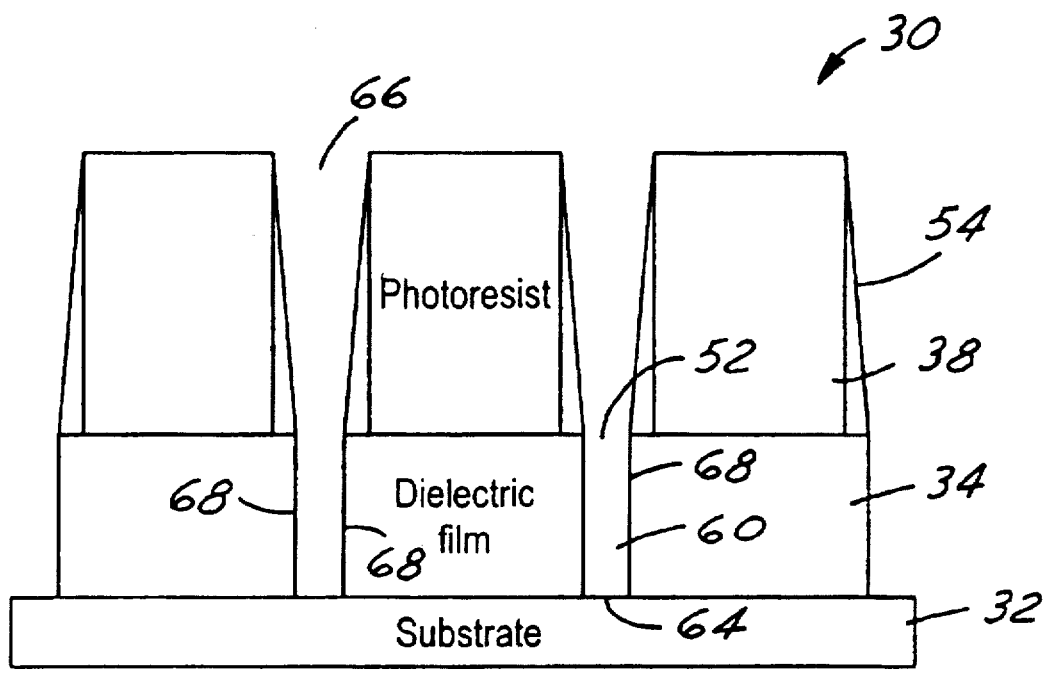
FIG. 5 is an enlarged, cross-sectional view of the present invention semiconductor device shown in FIG. 4 after contact holes of reduced dimensions are formed in a dry etching process by using a polymeric sidewall spacers as masks.

In the final process step, contact holes 60 of reduced dimensions are formed. This is shown in FIG. 5. In practice, the chamber condition can be switched over to oxide dry etch at 200 m Torr chamber pressure, 1200 W power level and a reactant gas mixture of 25 sccm $CF_4$, 25 sccm $CEF_3$ and 300 sccum Ar. The polymeric spacers 54 are used as masks to reduce the dimensions of the contact holes 60 formed. For instance, the initial openings for the contact hole (FIG. 4) may be in the range of approximately 0.4–0.5 μm (as shown at opening 56) which is enlarged to a dimension of approximately 0.6 μm after the oxide dry etch process for forming the contact hole 60 is conducted (shown as opening 66 in FIG. 5). While depending on the thickness of the polymeric spacer 54 and specifically the thickness of the spacer at the bottom, the size of the opening 52 can be in the range of 2–3 μm. Due to the fact that a slightly tapered sidewall 68 is normally produced during the oxide dry etch process, the resulting dimension of the contact hole 60 at the bottom surface 64 can be approximately 1–2 μm.

After the formation of contact holes 60 (or line spacings or trenches), the photoresist layer 38 can be suitably stripped by any known methods such as an oxide ashing process combined with a wet cleaning process. The semiconductor device 30 is then ready for the next processing step of depositing a conductive layer for forming the contact plugs (not shown).

The present invention novel method of forming contact holes of reduced dimensions by utilizing polymeric sidewall spacers on a photoresist layer is therefore amply exemplified. It should be noted that several processing advantages are provided by the present invention novel method. First the polymeric material layer used for forming the sidewall spacers can be in-situ deposited in the same process chamber to be used for a subsequent dry etch process. This is beneficial in that valuable process time that is necessary for transferring wafers between chambers can be saved and further, the chances of contamination during such transfer can be eliminated. Moreover, by utilizing the present invention novel method, contact holes of reduced dimensions can be suitably fabricated without using expensive deep UV processes and costly deep-UV photoresist materials. Contact holes in the dimensions of 0.25 μm or smaller can be suitably fabricated. The present invention novel method can be carried out in a fabrication plant by making minor modifications in existing fabrication process since the reactant gases used in depositing the polymeric sidewall spacers are substantially the same as those used in the subsequent dry etch process.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. A method of forming cavities of reduced dimensions by using polymeric spacers in-situ formed on photoresist sidewalls comprising the steps of:
   providing a semi-conducting substrate having a non-conducting layer deposited on top,
   depositing and patterning a photoresist layer on top of said non-conducting layer to expose a predetermined area for said cavities on said non-conducting layer,
   depositing a layer of a polymeric material to cover said photoresist and said predetermined area of said non-conducting layer,
   anisotropically etching said layer of polymeric material to form polymeric spacers on said photoresist sidewalls, and
   etching cavities of reduced dimensions through said non-conducting layer without removing said photoresist layer to expose said semi-conducting substrate.

2. A method according to claim 1, wherein said cavities formed are selected from the group consisting of contact holes, line spacings and trenches.

3. A method according to claim 1, wherein said polymeric sidewall spacers are formed by a reactive ion etching technique.

4. A method according to claim 1 further comprising the step of removing said photoresist layer from said non-conducting material layer.

5. A method according to claim 1, wherein said conformal layer of polymeric material is deposited by reactant gases the same as those utilized in etching said cavities in said non-conducting layer.

6. A method according to claim 1, wherein said layer of polymeric material is deposited of reactant gases comprising $CHF_3$.

7. A method according to claim 1, wherein said layer of polymeric material is deposited of reactant gases comprising $CHF_3$, $C_4F_8$, and $CO$.

8. A method according to claim 1, wherein said polymeric sidewall spacers are used as a mask in forming said cavities in said non-conducting layer.

9. A method according to claim 1, wherein said deposition step for said polymeric layer and said etching steps for forming said polymeric spacers and for etching said cavities of reduced dimensions are conducted in the same process chamber.

10. A method according to claim 1, wherein said cavities in said non-conducting layer are formed in an oxide dry etch process.

11. A method of forming cavities in a non-conducting layer comprising the steps of:
   providing a pre-processed semi-conducting substrate having a non-conducting layer and a patterned photoresist layer sequentially deposited and formed on top,
   conformally depositing a polymeric material layer on top of said non-conducting and said photoresist layer,
   etching said polymeric material layer forming polymeric sidewall spacers on said patterned photoresist layer, and
   etching cavities in said non-conducting layer exposing said semi-conducting substrate.

12. A method according to claim 11, wherein said non-conducting layer is formed of a dielectric material.

13. A method according to claim 11, wherein said semi-conducting substrate is a silicon substrate.

14. A method according to claim 11, wherein said polymeric material layer and said non-conducting layer are etched by a dry etching technique.

15. A method according to claim 11, wherein said cavities formed are contact holes or line spacings.

16. A method according to claim 11 further comprising the step of removing said photoresist layer by oxide ashing and wet etching.

17. A method according to claim 11, wherein said cavities formed in said non-conducting layer have a diameter of not more than 0.5 μm.

18. A method of forming contact holes of reduced dimensions in a single process chamber comprising the steps of:
   providing a silicon substrate,
   depositing a dielectric layer on said substrate,
   depositing a photoresist layer on said dielectric layer,
   patterning said photoresist layer to form first openings exposing said dielectric layer for said contact holes,
   conformally depositing a polymeric material layer in said first openings and on top of said photoresist layer,
   anisotropically etching said polymeric material layer forming polymeric sidewall spacers in said first openings covering the sidewalls of said photoresist layer,
   anisotropically etching said dielectric layer to form second openings exposing said silicon substrate by using said polymeric sidewall spacers as masks such that said second openings are smaller than said first openings to enable contact holes of reduced dimensions to be formed, and
   removing said photoresist layer from said dielectric layer.

19. A method according to claim 18, wherein said second openings have a diameter less than half of the diameter of said first openings.

20. A method according to claim 18, wherein said polymeric material layer is deposited of reactant gases the same as those used in the anisotropic etching process for forming said second openings.

* * * * *